United States Patent
Fujisaki et al.

(10) Patent No.: US 9,911,916 B2
(45) Date of Patent: Mar. 6, 2018

(54) METHOD FOR VAPOR-PHASE GROWTH OF PHASE-CHANGE THIN FILM, AND DEVICE FOR VAPOR-PHASE GROWTH OF PHASE-CHANGE THIN FILM

(71) Applicant: HITACHI, LTD., Chiyoda-ku, Tokyo (JP)

(72) Inventors: Yoshihisa Fujisaki, Tokyo (JP); Yoshitaka Sasago, Tokyo (JP); Takashi Kobayashi, Tokyo (JP)

(73) Assignee: HITACH, LTD., Tokyo (JP)

( * ) Notice: Subject to any disclaimer, the term of this patent is extended or adjusted under 35 U.S.C. 154(b) by 0 days.

(21) Appl. No.: 15/128,395

(22) PCT Filed: Mar. 28, 2014

(86) PCT No.: PCT/JP2014/059219
§ 371 (c)(1),
(2) Date: Sep. 22, 2016

(87) PCT Pub. No.: WO2015/145746
PCT Pub. Date: Oct. 1, 2015

(65) Prior Publication Data
US 2017/0125675 A1  May 4, 2017

(51) Int. Cl.
*H01L 45/00* (2006.01)
*C23C 16/22* (2006.01)
(Continued)

(52) U.S. Cl.
CPC .......... *H01L 45/1616* (2013.01); *C23C 16/22* (2013.01); *C23C 16/4482* (2013.01);
(Continued)

(58) Field of Classification Search
CPC ... H01L 45/1616; H01L 45/06; H01L 45/144; H01L 45/1233; H01L 27/2481; C23C 16/4482; C23C 16/22
See application file for complete search history.

(56) References Cited

U.S. PATENT DOCUMENTS

2008/0308785 A1* 12/2008 Park .................. C23C 16/34
257/4
2009/0250004 A1* 10/2009 Yamada ............ C23C 16/45514
118/722

(Continued)

FOREIGN PATENT DOCUMENTS

| JP | 2008-311664 A | 12/2008 |
| JP | 2010-59546 A1 | 3/2010 |
| WO | 20071066472 | 6/2009 |

OTHER PUBLICATIONS

Ran-Young Kim et al.; "Structural Properties of Ge2Sb2Te5 Thin Films by Metal Organic Chemical Vapor Deposition for Phase Change Memory Applications"; Applied Physics Letters 89, pp. 102-107; 2006.

(Continued)

Primary Examiner — Caridad Everhart
(74) Attorney, Agent, or Firm — Miles & Stockbridge P.C.

(57) ABSTRACT

In order to form a phase change thin film being flat in a nanometer level and having a good coverage, which is essential for realizing a three-dimensional ultra-high integrated phase change memory, an equipment for vapor phase growth of a phase change thin film is provided which form a phase change thin film at low temperature while the film is being kept in a completely amorphous state. A structure is provided in which an ammonia cracker is connected to a reactor of the equipment for vapor phase growth for a nitrogen radical obtained by decomposing ammonia gas. Consequently, low temperature decomposition of metal organic precursor and film formation on a substrate surface are realized. With the use of this equipment, it is possible to realize a completely amorphous film which has a flat surface at a low temperature of 135° C. using an amine complex as a Ge precursor.

19 Claims, 9 Drawing Sheets

(51) Int. Cl.
*C23C 16/448* (2006.01)
*H01L 27/24* (2006.01)

(52) U.S. Cl.
CPC .......... *H01L 27/2481* (2013.01); *H01L 45/06* (2013.01); *H01L 45/1233* (2013.01); *H01L 45/144* (2013.01)

(56) References Cited

U.S. PATENT DOCUMENTS

| | | |
|---|---|---|
| 2010/0055829 A1 | 3/2010 | Im et al. |
| 2011/0180774 A1 | 7/2011 | Park et al. |
| 2011/0268881 A1* | 11/2011 | Jung .................. C07F 7/30 427/255.394 |
| 2012/0319069 A1 | 12/2012 | Park et al. |

OTHER PUBLICATIONS

Office Action dated Sep. 12, 2017 for related Japanese Application No. 2016-509840.

* cited by examiner

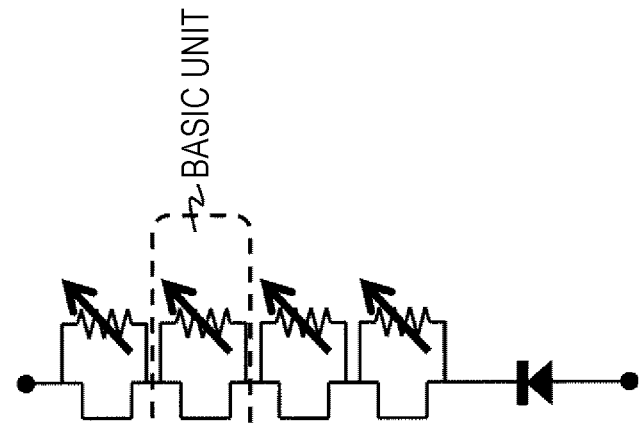
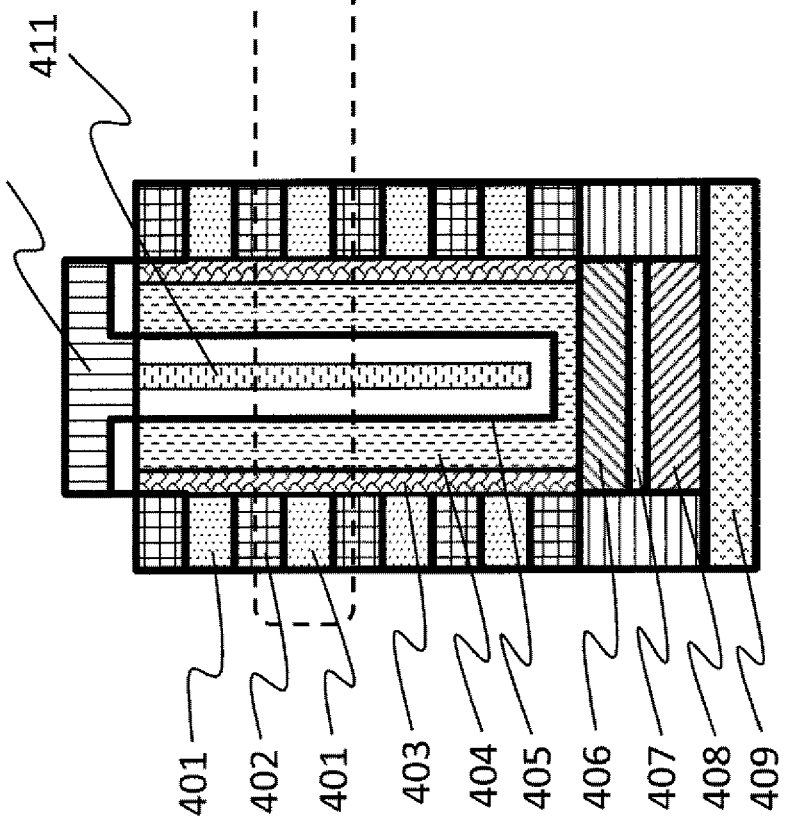
FIG 4.(a)
FIG 4.(b)
BASIC UNIT
401
402
401
403
404
405
406
407
408
409
410
411

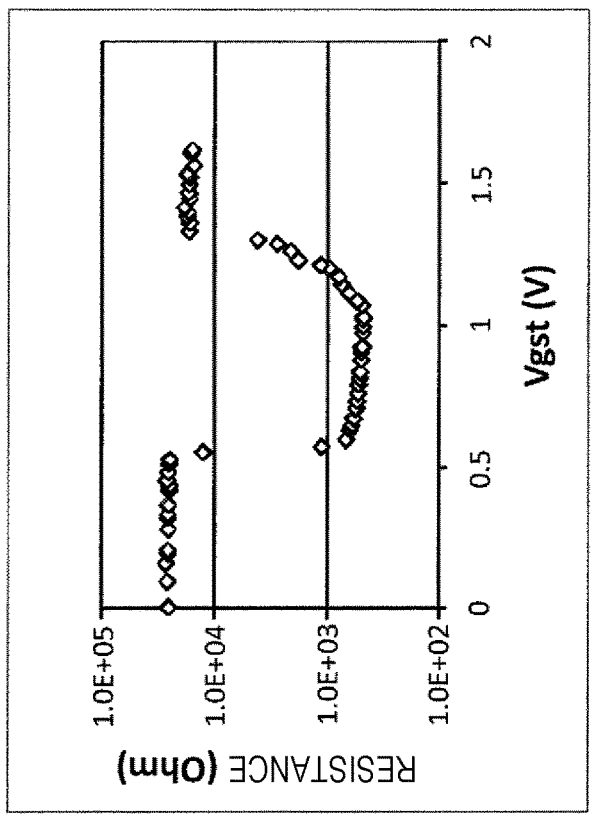
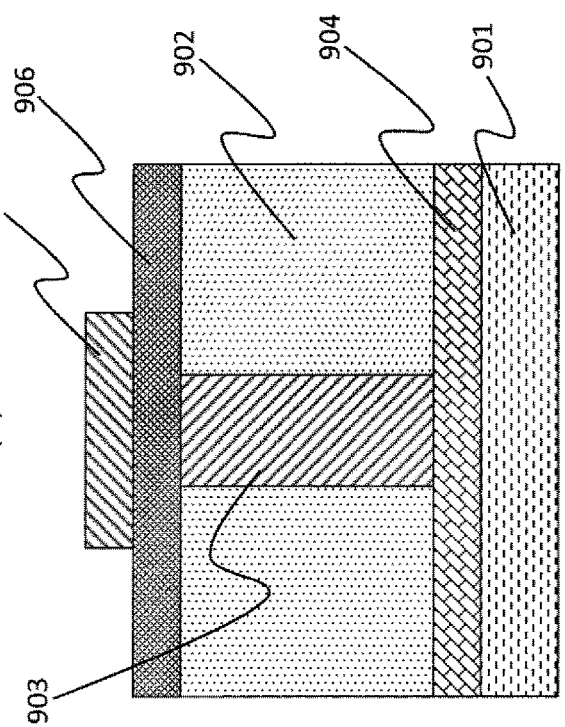
FIG 9.(b)
FIG 9.(a)

METHOD FOR VAPOR-PHASE GROWTH OF PHASE-CHANGE THIN FILM, AND DEVICE FOR VAPOR-PHASE GROWTH OF PHASE-CHANGE THIN FILM

TECHNICAL FIELD

The present invention relates to a method for vapor phase growth of a phase change thin film, and a device for vapor phase growth of a phase change thin film, in which a phase change thin film, which can be used as a material for a semiconductor non-volatile memory, is formed by a metal organic chemical vapor deposition method.

BACKGROUND ART

It is possible to cause phase transition of a phase change material including a chalcogenide element from a crystalline state to an amorphous state at relatively low temperatures such as about 600° C., or from an amorphous state to a crystalline state at lower temperatures. Such a phase change material is used for media such as a compact disk (CD) and a digital versatile disk (DVD). The electrical resistance of this material varies greatly between cases where the material is in a crystalline state and where the material is in an amorphous state. Therefore, studies have been in progress for the purpose of using the above characteristic to utilize the material as a storage material for a semiconductor memory, and some studies yield practical applications. Since the memory has a simple structure, the memory is thought to be a potential candidate for an ultra-high integrated non-volatile memory.

On the other hand, phase change memories currently practically used are still inferior to flash memories, which are widely-used semiconductor non-volatile memories, in terms of high integration. For example, in a case where a memory cell array is configured by a conventional phase change memory cell illustrated in FIGS. 3(a) and 3(b), and when the minimum working size is denoted by F, an area per one cell is $8F^2$ even when ideal design is realized. In comparison thereto, an area per one cell in the most advanced NAND-type flash memories is $4F^2$, and an occupied area per one bit is reduced to $2F^2$ by further employing multi-level technology.

In order to realize a large-capacity phase change memory which replaces a flash memory expected to have a limitation in miniaturization thereof for the purpose of reducing bit cost of SSD expected to have a large market in a mass storage field, it is necessary to use not the conventional phase change memory illustrated in a sectional view of an element in FIGS. 3(a) and 3(b), but a structure suitable for miniaturization. Specifically, as illustrated in FIG. 4(b), a chain-cell structure of a NAND-type circuit system, which is the same as that of an ultra-high integrated flash memory, is used to relatively reduce a region occupied by a memory cell selecting transistor, and then the obtained structure is formed into a three-dimensional structure as illustrated in FIG. 4(a). Consequently, it is possible to realize a phase change memory more suitable for high integration than a flash memory. A sectional structure in FIG. 4(a) and an equivalent circuit in FIG. 4(b) are drawn so as to correspond to each other. A portion enclosed by a dotted line in the figure is one memory cell, and it is possible to build up a structure in which the memory cell is repeatedly piled up in a vertical direction as many times as needed. Details of the structure illustrated in FIGS. 4(a) and 4(b) are described in a literature, 2012 Symposium on VLSI Technology Technical Digest of Technical Papers, p. 35. However, this is an application example of the present invention and is different from the essence of the present invention. Therefore, a detailed description thereof will be omitted.

In order to realize the three-dimensional chain-cell structure, it is necessary to uniformly deposit an ultrathin phase change film having a thickness of several nanometers on a side wall of a fine deep hole or a deep groove formed in a vertical direction of a semiconductor substrate. As a method for forming a uniform and flat phase change thin film on a substrate having such a complex stereoscopic structure, a metal organic chemical vapor deposition method (MOCVD method) is proposed.

CITATION LIST

Non Patent Literature

NPL 1: Appl. Phys. Lett. 89, 102107 (2006)

SUMMARY OF INVENTION

Technical Problem

In the MOCVD method for a phase change thin film conventionally reported, a film is usually formed at a substrate temperature of about 300° C. That is because general metal organic precursors start decomposing at 260° C. or higher, and this is the best condition for efficient film formation.

On the other hand, most of the phase change materials start crystallizing at a temperature of a little lower than 200° C. Therefore, a formed phase change thin film has conspicuous crystal grains and is markedly irregular, and there have been few examples in which a film is formed to be flat in a nanometer order. For example, as illustrated in FIG. 3 of NPL 1, crystallization has been progressed and a structure including randomly aligned crystal grains of micrometer order is formed on the surface of the phase change film prepared with conventional technology, and a flat surface cannot be obtained. With such technology, a uniform continuous film cannot be obtained when miniaturization is advanced and the thickness of a phase change film is reduced to about 10 nm. Consequently, a three-dimensional fine element such as that illustrated in FIG. 4(a) cannot be prepared with the conventional technology, which is a problem.

An object of the present invention is to provide technology with which crystallization during film formation is suppressed and a phase change thin film which is flat in a nanometer order and uniform is formed on a substrate having a three-dimensional structure. The present invention relates to an MOCVD method for a phase change thin film and a device therefor, and provides novel technology which solves a problem in conventional MOCVD technology and makes it possible to realize a three-dimensional chain-cell. The above and other objects, and a novel feature of the present invention will be apparent from the description given herein and the accompanying drawings.

Solution to Problem

In order to solve the above problem, in the present invention, a device for vapor phase growth of a phase change thin film using an metal organic precursor is configured to include: an independent supply line that transports an metal organic precursor for each metal element constituting a phase change film into a growth chamber with a carrier gas; a nitrogen radical supply line that is independent from the organic metal supply line and supplies, into the growth chamber, a nitrogen radical generated by decomposing ammonia gas in a reaction chamber adjacent to the growth chamber; and on a substrate placed in the growth chamber, a gas mixer that switches the organic metal supply line to "alone" or "mixed" to supply the metal organic precursor. In the device, the nitrogen radical supply line is open into the growth chamber such that the nitrogen radical uniformly reaches the substrate placed in the growth chamber.

Furthermore, in order to solve the above problem, in the present invention, the device for vapor phase growth of a phase change thin film is configured such that the nitrogen radical supply line is connected to the gas mixer in the growth chamber, and the metal organic precursor and the nitrogen radical are mixed in the gas mixer right above the substrate, and then supplied to the substrate.

Furthermore, in order to solve the above problem, in the present invention, the device for vapor phase growth of a phase change thin film is configured such that the organic metal supply line transports organic metal atomized or vaporized by bubbling of the carrier gas or a vaporizer provided in the reaction chamber to the growth chamber with a carrier gas.

Furthermore, in order to solve the above problem, in the present invention, the device for vapor phase growth of a phase change thin film is configured such that catalytic metal heated in vacuum is used to decompose ammonia gas in the reaction chamber.

Furthermore, in order to solve the above problem, in the present invention, the method for vapor phase growth of a phase-change thin film includes: transporting each metal organic precursor with a carrier gas to a substrate placed in a growth chamber, through an independent supply line for each of metal elements constituting a phase change film; supplying nitrogen radical generated by decomposing ammonia gas with heated catalytic metal in a reaction chamber adjacent to the growth chamber to the substrate placed in the growth chamber through an independent supply line; and forming a phase change thin film in an amorphous state on the substrate retained at a temperature of 150° C. or lower, by promoting decomposition of each of the metal organic precursors by the nitrogen radical.

Advantageous Effects of Invention

Followings are simple descriptions of advantageous effects obtained by a representative invention among the inventions disclosed in the application.

(1) With the use of a phase change thin film forming method using the technology of the present invention, it is possible to uniformly form a phase change thin film having a completely amorphous structure on a substrate having a three-dimensional structure. For example, when forming a phase change film using a device and a process of a first embodiment of the present invention, a flat film can be obtained of which a root mean square (RMS) value is 0.3 nm. The RMS is an index indicating unevenness on a film surface.

(2) In addition, since the amorphous phase change thin film is flat in a nanometer order, it is possible to form a phase change chain-cell on a side wall of a deep hole or a deep groove formed on the substrate.

(3) Furthermore, a three-dimensional phase change memory cell prepared as described above can be more highly integrated than a NAND-type flash memory, and thereby an inexpensive SSD can be realized.

BRIEF DESCRIPTION OF DRAWINGS

FIG. 4(a) is a sectional structural drawing and FIG. 4(b) is an equivalent circuit diagram of a three-dimensional phase change element which can be prepared by using the present invention.

FIG. 9(a) is a sectional structural drawing of a phase change element according to a fifth embodiment of the present invention, and FIG. 9(b) is an example of a rewriting characteristic obtained with the prepared element.

DESCRIPTION OF EMBODIMENTS

Figure 1:
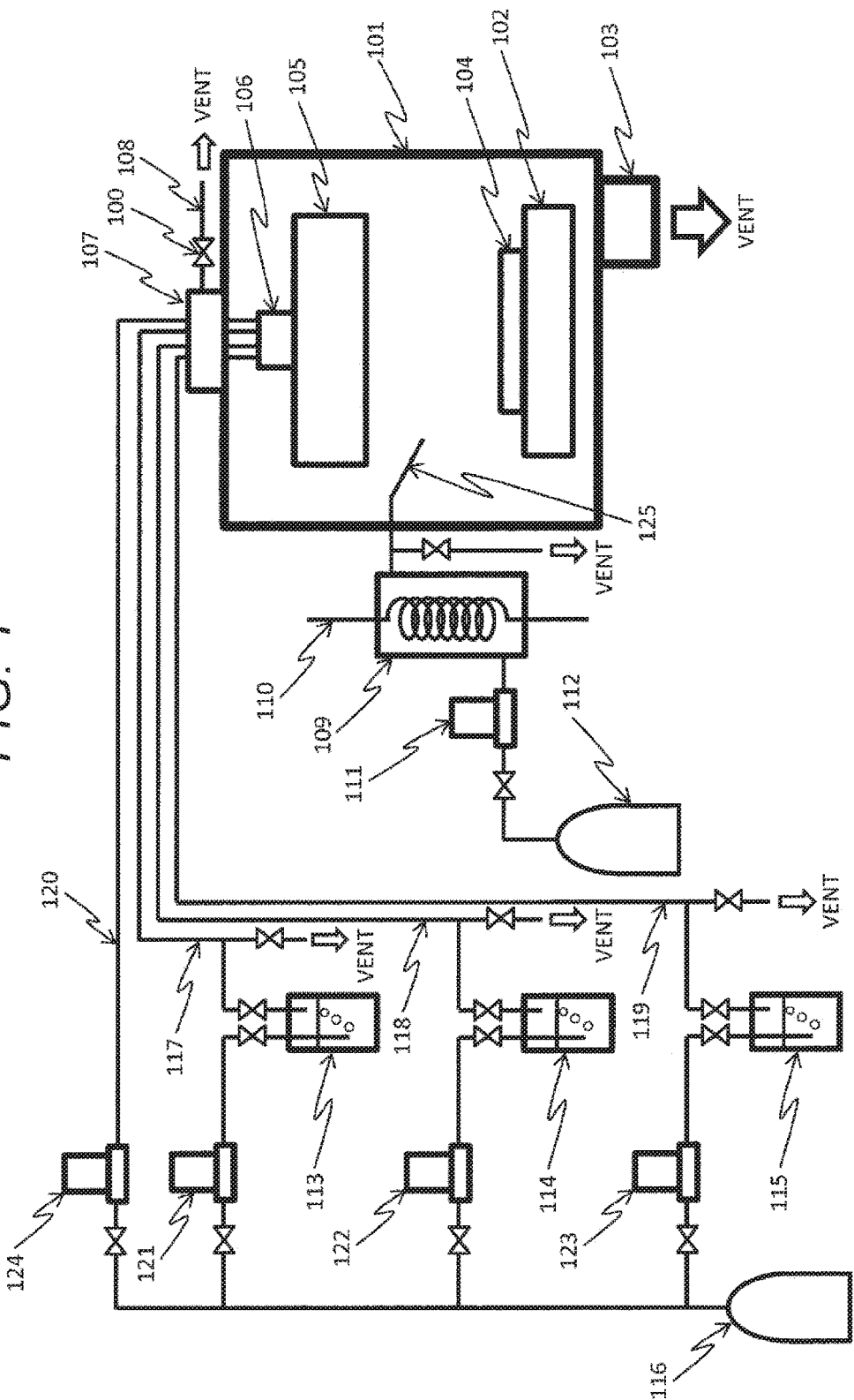
FIG. 1 is a configuration diagram of an MOCVD equipment of a first embodiment of the present invention.

Hereinbelow, embodiments of the present invention will be described in detail based on the drawings. In all drawings for explaining the embodiments, the same members are denoted by the same reference signs in principle, and repetitive descriptions thereof will be omitted.

(1) Summary of a method for vapor phase growth of a phase change thin film.

Following is a simple description of a summary of a representative invention among the inventions disclosed in the application. In other words, compounds of Ge, Sb, and Te are used as a phase change material and a thin film thereof is formed by an MOCVD method. On that occasion, an amino complex raw material which is unstable but can be decomposed at low temperature is used as a precursor of Ge, and nitrogen radicals obtained by thermal decomposition of ammonia gas are simultaneously supplied for the purpose of promoting the decomposition thereof. Consequently, a Ge film can be formed at temperatures lower than 300° C.

On the other hand, Sb and Te tend to form metal crystal grains having rhombohedral and hexagonal structures at low temperature, respectively, and a decrease in the decomposition temperatures of these precursors is a negative factor for forming a flat thin film. In other words, a first principle of the present invention resides in that, for example, when compounds of Ge, Sb, and Te are formed, precursors are selected such that an metal organic precursor of Ge has the lowest decomposition temperature. In that case, the decomposition temperature of Ge precursor greatly affects substrate temperature setting.

However, in the MOCVD method, a vapor phase reaction is caused above a substrate in addition to the thermal decomposition of each precursor. Therefore, the decomposition is not progressed only by the thermal decomposition of each metal organic precursor. In other words, a second principle of the present invention resides in that deposition of compounds is promoted at temperatures lower than the thermal decomposition temperatures of precursors by actively using a reaction of each precursor in a vapor phase in a reaction furnace. The second principle includes two advantages described below. In other words, when supplying a precursor in accordance with the first principle, the thermal decomposition temperature of the Ge precursor primarily affects the substrate temperature setting greatly. However, by actively using the vapor phase reaction, it is possible to decrease also the thermal decomposition temperature of the Ge precursor itself. Consequently, a phase change thin film can be formed at temperatures lower than 150° C. by supplying precursors optimally including supplying conditions of ammonia gas. For example, in a case of a Ge2Sb2Te5 compound, which is a representative phase change material, crystallization starts at temperatures of about 150° C., and a formed film is markedly irregular. If supplying conditions of precursors and the substrate temperature are appropriately selected in accordance with the first and second principles, it is possible to form a completely amorphous phase change thin film.

In general, thermal decomposition of ammonia gas needs high temperatures at about 900° C., and ammonia cannot be decomposed in a vapor phase in the vicinity of a substrate at 150° C. or lower. Therefore, it is necessary to decompose ammonia in advance, and then to introduce ammonia into an MOCVD reactor. However, nitrogen radicals generated from ammonia react, for example, at a side wall of a pipe leading to the reactor and disappear. Therefore, it is preferable to connect an ammonia decomposition device directly to the reactor. Accordingly, a decomposition device is used which employs a catalytic reaction for decomposing ammonia at low temperature. It is possible to decompose ammonia gas even at temperatures lower than 400° C. when using a catalytic reaction exerted by Ir, Rh, Pd, or Pt, and even when the device is directly connected to the MOCVD reactor in which a CVD reaction is progressed at low temperature, there is little influence on the configuration of the reactor. Specifically, when heating a Pt wire in a vacuum container, and ammonia gas is flowed into the container while controlling a temperature, ammonia is decomposed at low temperature by a catalytic reaction on a Pt surface to generate nitrogen radicals. Nitrogen molecules, a byproduct obtained by the above reaction, are not exposed to a high temperature at 900° C., and therefore, the nitrogen molecules do not disturb growth conditions even if the nitrogen molecules reach the substrate. In addition, there is a method for decomposing ammonia by using RF plasma or the like. However, such a method is not an ideal since particles or unnecessary contaminants are likely to be mixed in.

On the other hand, a phase change element is exposed to high temperatures of about 600° C. when the phase change memory cell is in operation. If a large amount of hydrogen remains in the film, the hydrogen may vaporize and cause a significant physical damage to the memory cell. Accordingly, a third feature of the present invention resides in that a step is included in which an amorphous thin film formed at low temperature is heat treated so that the concentration of residual hydrogen is reduced to a concentration equal to or less than a concentration which causes a physical damage to the memory cell. On that occasion, it is possible to vaporize only hydrogen by appropriately selecting a temperature of the heat treatment and to cause carbon supplied from an metal organic precursor to remain in the film. The residual carbon exhibits an effect of increasing a crystallization temperature of the phase change thin film, and can eliminate an effect of a physical damage while maintaining the amorphous state.

First Embodiment (2) Configuration of a First MOCVD Equipment

FIG. 1 illustrates an example of a configuration of a first MOCVD equipment of the present invention. With the use of the equipment, as an example, a phase change film with a Ge2Sb2Te5 composition can be formed at a low temperature of 135° C. while the film is being kept in a completely amorphous state. First, in the figure, reference numeral 100 denotes an air operated valve provided in each pipe, which can open and close in accordance with a program of a computer. Hereinbelow, the configuration of the equipment will be described.

An MOCVD reactor (reaction furnace, growth chamber) 101 is provided with pipes 117, 118, and 119 through which metal organic precursors of Ge, Sb, and Te are introduced. Liquid precursors are transported into the reactor by bubbling with a carrier gas 116 such as nitrogen or hydrogen. Containers 113, 114, and 115 and the pipes 117, 118, and 119 of respective liquid precursors have a structure capable of controlling temperatures so as to obtain appropriate vapor pressure. The precursors are supplied into the reactor at a target molar flow rate by adjusting mass flow controllers 121, 122, and 123 which adjust a flow rate of a carrier gas and a precursor container temperature controller. A pipe system of each precursor is also connected to a vent line 108 through an integrated valve 107 provided right in front of the reactor. It is possible to switch supply of gas from a vent to the reactor after securing a stable gas flow.

The gases which have passed through the pipe systems are mixed to a certain extent in a gas mixer 106 provided in the reactor. Then the obtained mixed gas is led to a shower head 105, and uniformly reaches a substrate 104 as a mixed gas including three precursors of Ge, Sb, and Te. The shower head is provided with a temperature control mechanism, and is controlled such that a reaction does not progress in the shower head. In addition, an inner wall and an outer wall of the shower head were coated with SiO2 so as to prevent metal, on which the precursors are easily deposited, from being exposed. The coating may be performed with other heat resistant insulating material, such as alumina and Teflon. The substrate 104 is fixed to a susceptor 102 with a built-in substrate heater. Besides the pipes for three precursors, a pipe 120 through which only a carrier gas is lead into the shower head is provided, and thereby purge of the shower head and the reactor can be performed. A stainless steel cylinder 109 was connected to a side of the MOCVD reactor, and a filament 110 made of a Pt wire was provided therein. Hereinbelow, the stainless steel container is referred to as an ammonia cracker. Ammonia gas 112 of which flow rate is controlled by a mass flow controller 111 is flowed into the ammonia cracker along the Pt filament. The filament is disposed spirally such that a catalytic reaction on the Pt surface is caused efficiently. The ammonia cracker was connected to the reactor through a pipe, and was disposed such that the length of the pipe was physically minimized in order to prevent generated nitrogen radicals from disappearing. The pipe in the reactor, which is extending from the cracker, is disposed such that the generated nitrogen radicals directly reach the substrate not through the shower head, and thereby decomposition of the precursors in a vapor phase is prevented as much as possible and minimized. The cracker and the pipe from the cracker to the reactor are temperature-controlled, thereby suppressing disappearance of the nitrogen radicals generated in the pipe. Arrangement of a vacuum pump 103 or a piping nozzle 125 from the cracker needs to be designed such that the generated nitrogen radicals uniformly reach the substrate.

Although not illustrated in the figure, an orifice is provided on an exhaust side of the vacuum pump. Pressure in the reactor is adjusted by adjusting the exhaust ability of the vacuum pomp. This is a technique generally used in a CVD equipment, and details thereof will not be particularly described. In addition, a trap for adsorbing a generated toxic gas, a toxic gas treatment facility for performing a combustion treatment of the toxic gas not adsorbed in the trap, and a scrubber for adsorbing a combusted gas are connected to an exhaust side of the orifice. These are also configurations generally used in a CVD equipment in which a toxic gas is generated, and details thereof will not be described.

Next, a method for forming a phase change thin film of Ge2Sb2Te5 using the equipment will be described. (N,N'-diisopropyl-dimethylguanidyl) (dimethylamino)germanium (2) as a precursor of Ge, tri(dimethylamino)antimony as a precursor of Sb, and (tertialy-buthyl) (2-propenyl) tellurium as a raw material of Te were used. A Ge precursor temperature, a Sb precursor temperature, and a Te precursor temperature are set to 40° C., 10° C., and 45° C., respectively, and respective pipes are kept at temperatures 30° C. higher than the respective raw material temperatures to prevent dew condensation in the pipes. First, nitrogen as a purge gas is flowed into precursor containers of Ge, Sb, and Te at 10 cc/min, respectively, to stabilize the flows right up to the reactor through the vent line 108. This state is maintained for five minutes. The Pt filament of the ammonia cracker is maintained at 400° C., and ammonia gas is flowed at 25 cc/min. This gas is also prevented from flowing into the reactor through the vent line, and the flow right up to the reactor is stabilized for five minutes.

On the other hand, the substrate 104 obtained by thermally oxidizing 100 nm of single crystal Si was cleanly pretreated, and then transported to the susceptor 102 in the reactor in a vacuum state. Thereafter, only nitrogen as a carrier gas was flowed and kept at 3 Torr and at 135° C. for two minutes, and the inside of the shower head 105 was purged. By this process, a uniform surface temperature of the substrate is obtained and a uniform film can be formed with good reproducibility.

Next, the purge was stopped and simultaneously therewith, the integrated valve 107 was operated to perform switching such that the Ge precursor was flowed into the reactor at 10 cc/min, and the precursor was introduced for 10 minutes. A seed layer having a thickness of 0.3 nm or less was formed on the substrate by this process. Pressure in the reactor at that time is 3 Torr. This seed layer forming process is performed for the purpose of improving reproducibility, and may be omitted. In addition, ammonia may be flowed at a flow rate of 25 cc/min through the ammonia cracker 109 simultaneously with the Ge precursor. In that case, the thickness of the seed layer increases to about 1 nm.

Thereafter, the integrated valve is operated to simultaneously flow the Sb precursor, the Te precursor, and ammonia, together with the Ge precursor. Flow rates of Sb and Te precursors were 10 cc/min each, and a flow rate of ammonia was 25 cc/min. The pressure in the reactor was kept at 3 Torr. This state is maintained for 40 minutes. 40 minutes later, flows of the Ge, Sb, and Te precursors and ammonia are switched to the vent line, simultaneously therewith, nitrogen for purging is introduced into the reactor, and the substrate temperature is decreased while maintaining the pressure at 3 Torr. When the substrate temperature is sufficiently decreased so that oxidation caused by oxygen in air can be negligible, a transportation system is operated to take the substrate out. A Ge2Sb2Te5 thin film having a thickness of about 40 nm is obtained by this process.

Figure 5:
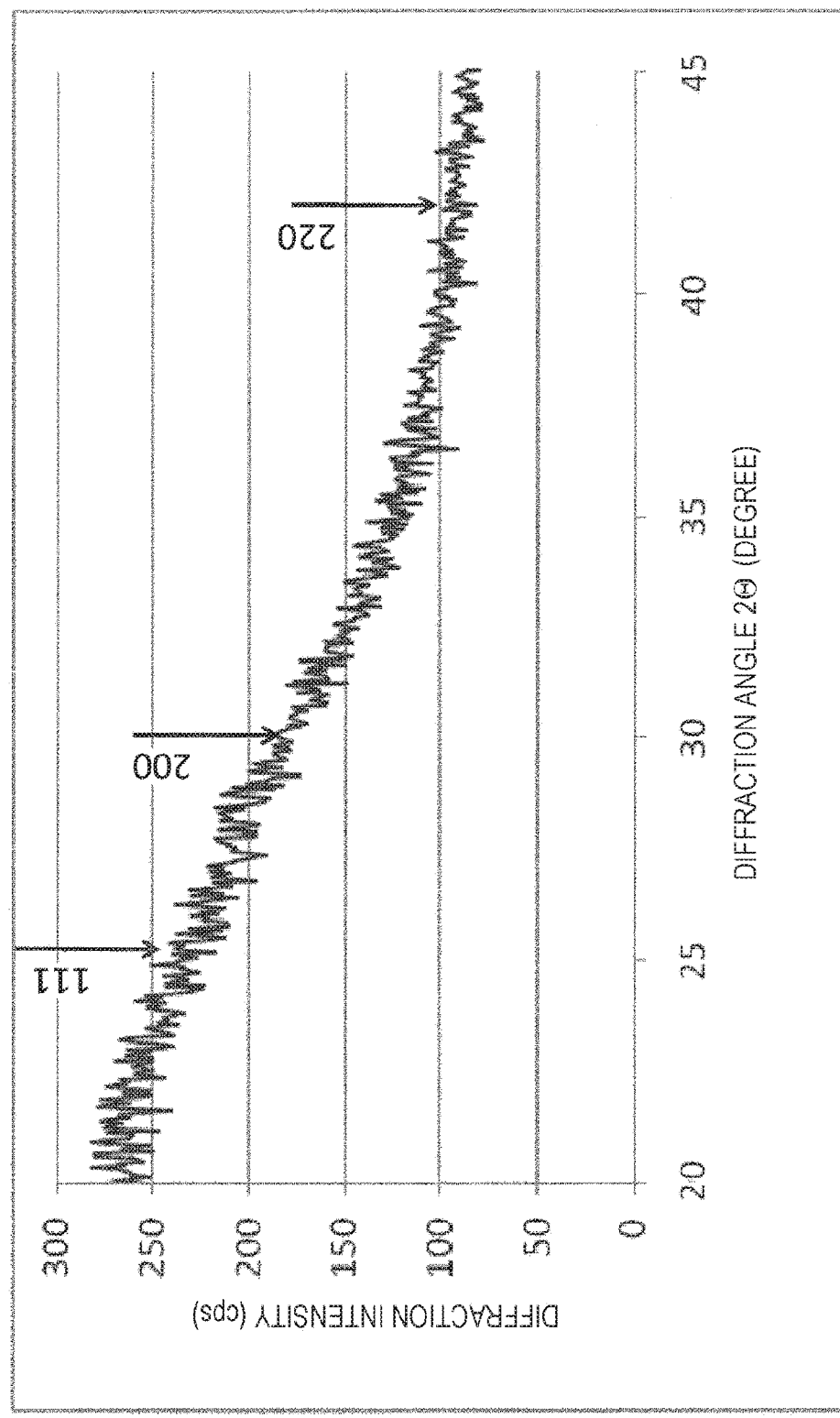
FIG. 5 is a graph illustrating X-ray diffraction chart of a phase change film formed in the first embodiment of the present invention.

FIG. 5 illustrates an X-ray diffraction pattern of the Ge2Sb2Te5 thin film formed in the above embodiment. Cu Kα1 line is used as an X-ray source, and the measurement is performed by a θ-2θ method (θ: incident angle, 2θ: diffraction angle). If the formed thin film has been crystallized, a peak of a face-centered cubic (fcc), which is a low temperature crystallized phase of Ge2Sb2Te5, should have appeared in the positions of 2θ indicated by arrows in the figure. However, there is no peak observed in the obtained data. Thus, the film formed in the above embodiment is found to be a completely amorphous. A root mean square (RMS)value of the roughness on the surface of the obtained film, which was determined by using an atomic force microscope, was 0.3 nm. This indicates that the film is flat in a nanometer level, and it has been revealed that the film can be used for the preparation of an ultra-high integrated three-dimensional phase change memory element.

Second Embodiment (3) Configuration of a Second MOCVD Equipment

Figure 6:
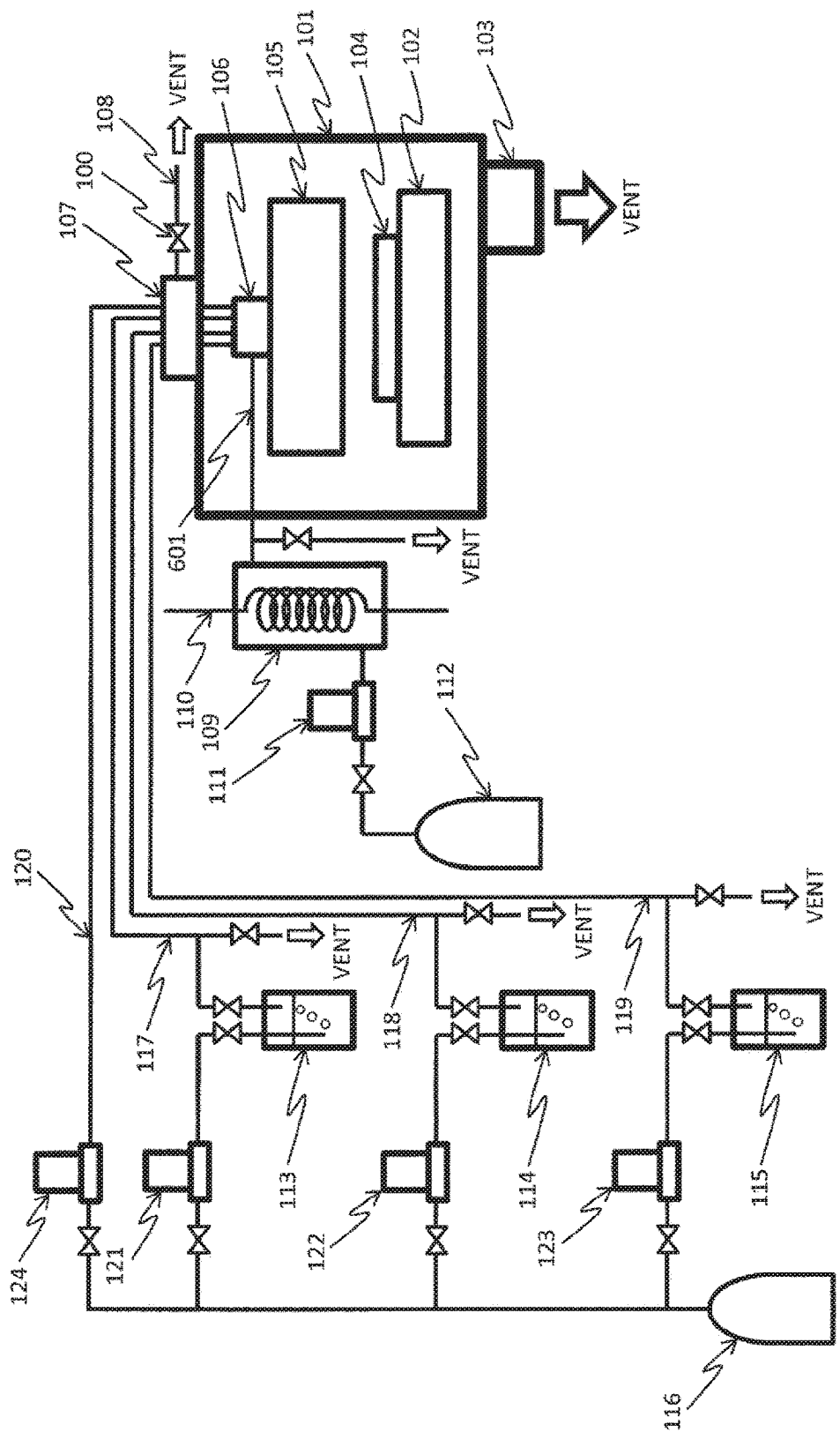
FIG. 6 is a configuration diagram of an MOCVD equipment of a second embodiment of the present invention.

FIG. 6 illustrates an example of a configuration of a second MOCVD equipment which is different from the equipment of the first embodiment. In the first embodiment, the equipment is configured such that the gas flowing out of the ammonia cracker 109 uniformly reaches the substrate 104 from the nozzle 125 in the reactor 101. However, in a case where a film is formed on a large substrate with a diameter of 300 mm or larger, it is extremely difficult to design the equipment such that the gas uniformly reaches the substrate. In the embodiment illustrated in FIG. 6, an ammonia cracker 109 was connected to a gas mixer 106 in a reactor 101 through a pipe 601. By doing so, it is possible to uniformly transport nitrogen radicals even in a case of a substrate with a large diameter. In addition, a distance between a substrate 104 and a shower head 105 was shortened, thereby improving gas use efficiency.

A film forming process using an MOCVD equipment having this configuration will be described below. (N,N'-diisopropyl-dimethylguanidyl) (dimethylamino) germanium (2) as a precursor of Ge, tri(dimethylamino) antimony as a precursor of Sb, and (tertialy-buthyl) (2-propenyl) tellurium as a precursor of Te were used. A Ge precursor temperature, a Sb precursor temperature, and a Te precursor temperature are set to 40° C., 10° C., and 45° C., respectively, and respective pipes are kept at temperatures 30° C. higher than the respective precursor temperatures to prevent dew condensation in the pipes. First, nitrogen as a purge gas is flowed into precursor containers of Ge, Sb, and Te at 5 cc/min, respectively, to stabilize the flows right up to the reactor through a vent line 108. This state is maintained for five minutes. A Pt filament of the ammonia cracker is maintained at 650° C., and ammonia gas is flowed at 10 cc/min. This gas is also prevented from flowing into the reactor through the vent line, and the flow right up to the reactor is stabilized for five minutes. When introducing nitrogen radicals through this route, there may be a case where the nitrogen radicals disappear by collision with an inner wall of the shower head. Therefore, the temperature of the filament was set to 650° C., which is higher than that in the first embodiment.

On the other hand, the substrate obtained by thermally oxidizing 100 nm of single crystal Si was cleanly pretreated, and then transported to a susceptor in the reactor in a vacuum state. Thereafter, only nitrogen as a carrier gas was flowed and kept at 3 Torr and at 135° C. for two minutes, and the inside of the shower head was purged. By this process, a uniform surface temperature of the substrate is obtained and a uniform film can be formed with good reproducibility.

Next, the purge was stopped and simultaneously the integrated valve 107 was operated to perform switching such that the Ge precursor was flowed into the reactor at 5 cc/min, and the precursor was introduced for 10 minutes. A seed layer having a thickness of 0.3 nm or less was formed on the substrate by this process. Pressure in the reactor at that time is 3 Torr. This seed layer forming process is performed for the purpose of improving reproducibility, and may be omitted. In addition, ammonia may be flowed at a flow rate of 25 cc/min through the ammonia cracker 109 simultaneously with the Ge precursor. In that case, the thickness of the seed layer increases to about 1 nm.

Thereafter, the integrated valve is operated to simultaneously flow the Sb precursor, the Te precursor, and ammonia, together with the Ge precursor. Flow rates of Sb and Te precursors were 5 cc/min each, and a flow rate of ammonia was 10 cc/min. The pressure in the reactor was maintained at 3 Torr. This state is maintained for 40 minutes. 40 minutes later, flows of the Ge, Sb, and Te precursors and ammonia are switched to the vent line, simultaneously therewith, nitrogen for purging is introduced into the reactor, and the substrate temperature is decreased while maintaining the pressure at 3 Torr. When the substrate temperature is sufficiently decreased so that oxidation caused by oxygen in air can be negligible, a transportation system is operated to take the substrate out. A Ge2Sb2Te5 thin film having a thickness of about 40 nm is obtained by this process.

Third Embodiment (4) Structure of a Filament Used for an Ammonia Cracker

Figure 7:
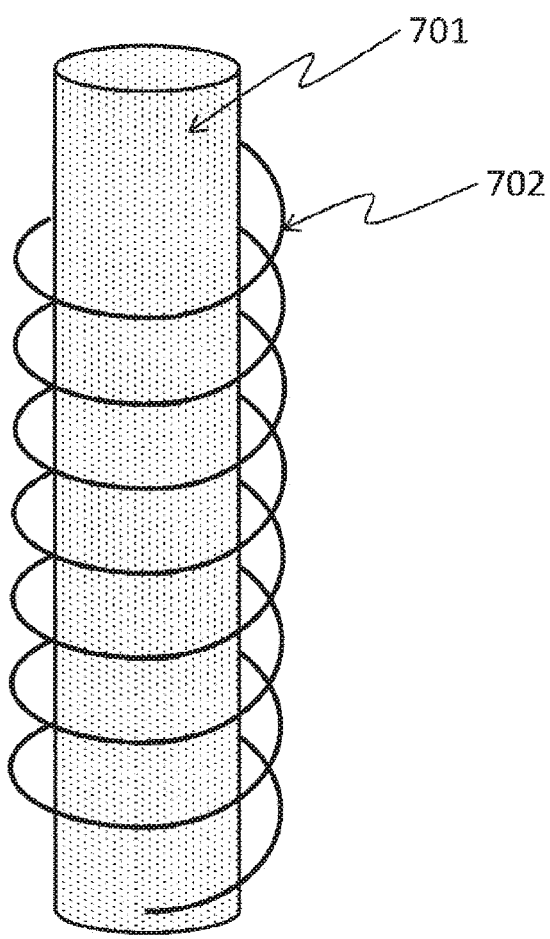
FIG. 7 is a structural drawing of a filament in an ammonia cracker according to a third embodiment of the present invention.

FIG. 7 illustrates a structure of a filament used for an ammonia cracker, which is different from those of the first and second embodiments. The electric conductivity of Pt is rather small at high temperature, and when Pt is used as a filament, nonuniformity is caused in heat generated thereby. In order to improve the nonuniformity, a component obtained by spirally winding a thin Pt wire 702 around a tungsten filament 701 was used as the filament of the ammonia cracker. The tungsten filament 701 was heated by an electric current applied thereto, and thereby the Pt wire 702 wound around the tungsten filament 701 was warmed. As a result, it became possible to make a Pt wire thinner and longer, thereby increasing a Pt surface area and making the temperature of the Pt wire uniform. As a result, although details of a film forming process will not be described, ammonia cracking efficiency was improved by 50% in comparison to those in the first and second embodiments.

It goes without saying that besides the structure illustrated in FIG. 7, for example, a structure is useful in which a surface of tungsten is coated with Pt, Pd, Ir, or the like.

Fourth Embodiment (5) Film Formation Result of Ge2Sb2Te5 Thin Film

Figure 8:
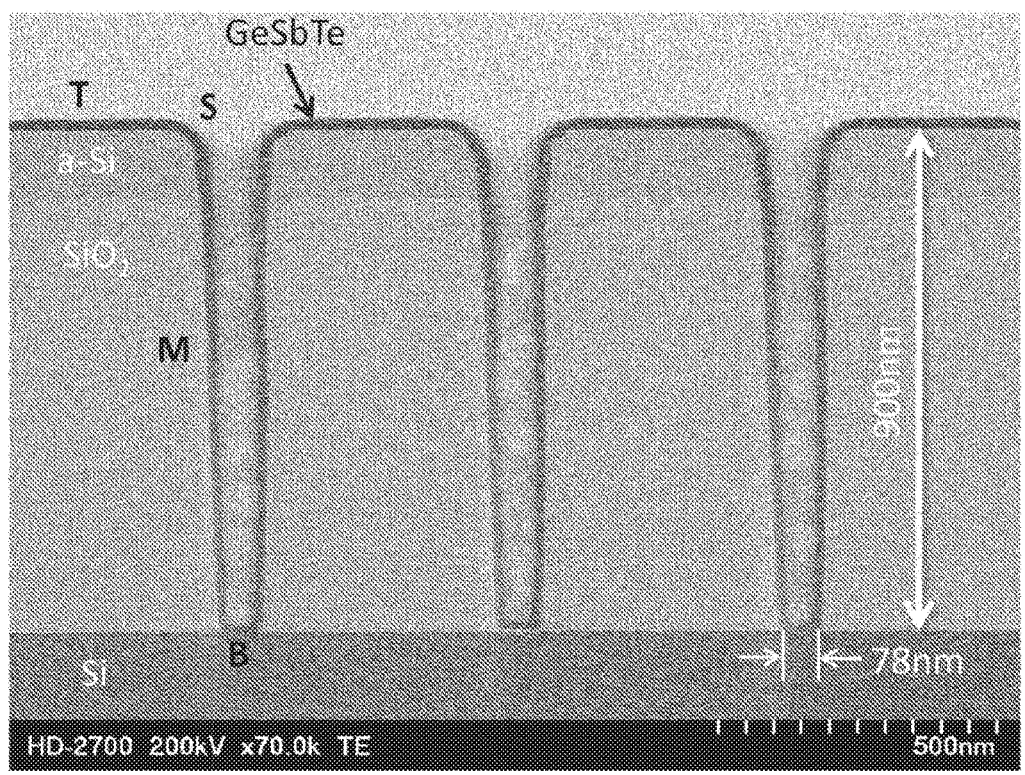
FIG. 8 is a sectional observation image of a phase change thin film deposited on a stepped substrate prepared in a fourth embodiment of the present invention.

FIG. 8 illustrates an observation photograph of a section of a Ge2Sb2Te5 thin film actually formed on an substrate having complex three dimensional structure. The substrate has a structure formed as follows: an SiO2 film and amorphous Si are formed on an Si single crystal, the SiO2 is processed using the amorphous Si located uppermost as a mask to form a deep hole having a hole bottom diameter of 78 nm and an aspect ratio of about 12. The Ge2Sb2Te5 film was formed by using a first MOCVD equipment having the same configuration as the equipment of the first embodiment, through the same process, under conditions that film forming time during which Ge, Sb, and Te precursors were supplied simultaneously was shortened to 20 minutes. It is found that a uniform film has been formed on the three-dimensional structure. Specifically, a film thickness of a hole bottom portion is 17.3 nm, and those of a hole middle portion and a portion in the vicinity of the hole opening are 20.5 nm and 21.5 nm, respectively. When a value obtained by dividing the film thicknesses of the hole middle portion and the hole bottom portion by the film thickness of the hole opening portion is expressed as coverage, the coverages of the hole middle portion and the hole bottom portion are 0.95 and 0.80, respectively. It is found, also from this data, that an ultra-high integrated three-dimensional phase change memory can be prepared by using the MOCVD equipment of the above embodiment and the film forming process of the above embodiment.

Fifth Embodiment (6) Switching Characteristic of a Phase Change Test Memory Cell FIGS. 9(*a*) and 9(*b*) illustrate a switching characteristic of a phase change test memory cell prepared by using the Ge2Sb2Te5 thin film formed in the first embodiment. FIG. 9(*a*) illustrates a sectional structure of an memory cell simply prepared for a test, and FIG. 9(*b*) illustrates a switching characteristic obtained.

Hereinbelow, the structure of the memory cell in FIG. 9(*a*) will be described. A tungsten wire 904 was deposited on an Si substrate crystal 901 and patterned in advance, and then SiO2 [902] was formed to 100 nm by a CVD method. Thereafter, a hole having a diameter of 180 nm was formed up to the tungsten wire 904 located below by a photolithography method, and tungsten 903 was filled therein by the CVD method. In order to remove roughness generated in the above process and excessively deposited tungsten, the surface of the substrate was flattened by a chemical mechanical polishing (CMP) method. The substrate thus prepared is put into an MOCVD furnace, and a Ge2Sb2Te5 thin film 906 is deposited by a method described below. Thereafter, tungsten as an upper electrode is deposited to a thickness of 50 nm by a sputtering method, and processed by the photolithography method to form an upper electrode 905 of the phase change memory cell.

Figure 2:
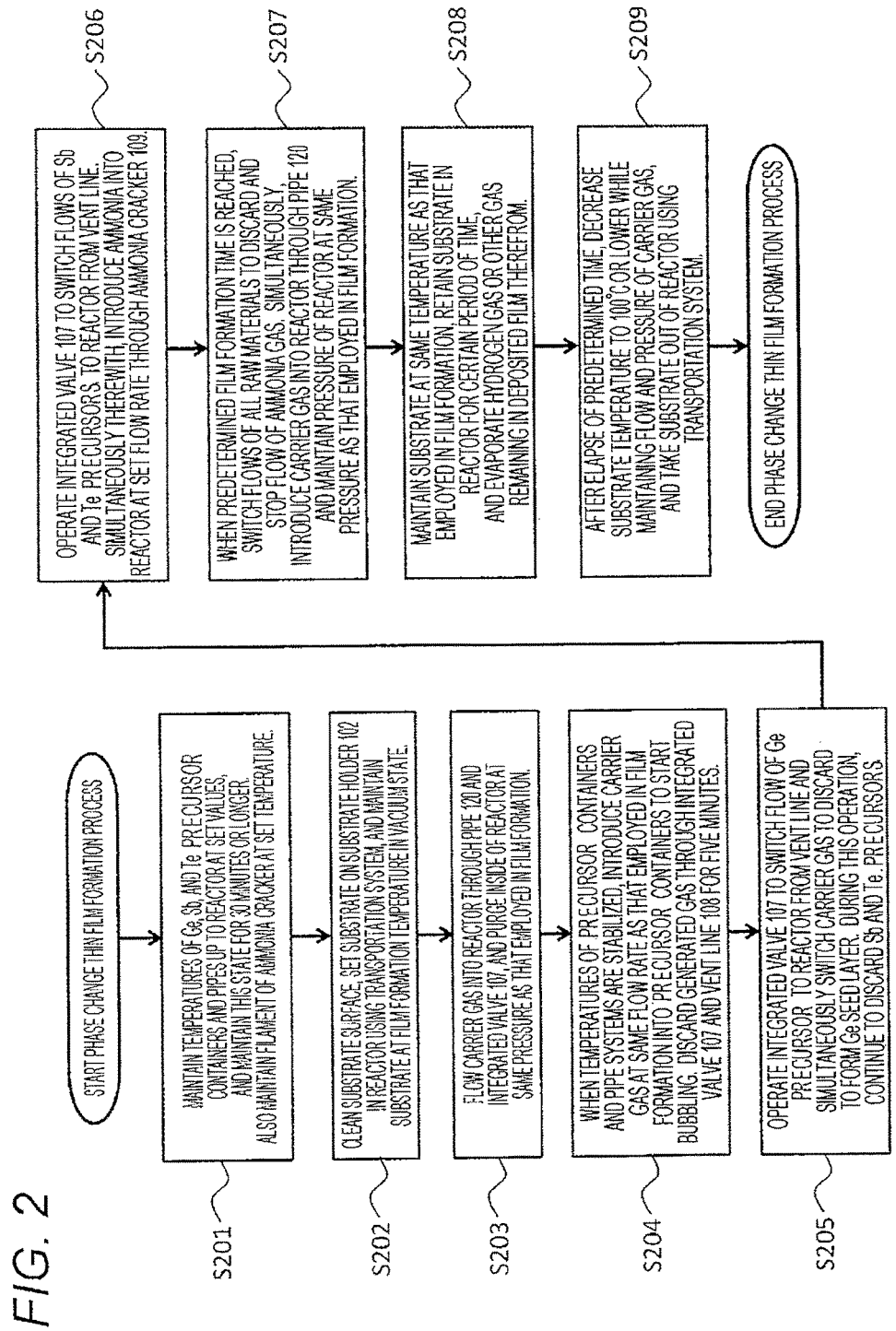
FIG. 2 is a process flowchart illustrating a film forming method of the first embodiment of the present invention.
Figure 3:
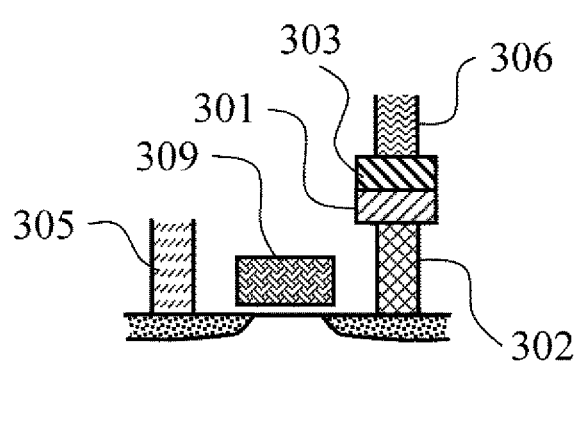
FIGS. 3(a) and 3(b) are drawings illustrating a general structure of a phase change element conventionally implemented.
Figure 3:
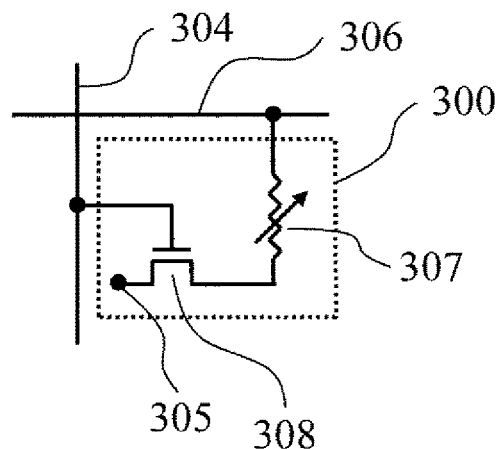

Next, a method for forming a phase change thin film of Ge2Sb2Te5 using this equipment (first MOCVD equipment) will be described in accordance with the flowchart illustrated in FIG. 2. In Step S201, (N,N'-diisopropyl-dimethyl-guanidyl) (dimethylamino) germanium (2) as a precursor of Ge, tri(dimethylamino) antimony as a precursor of Sb, and (tertialy-buthyl) (2-propenyl) tellurium as a precursor of Te were used. A Ge precursor temperature, a Sb precursor temperature, and a Te precursor temperature are set to 40° C., 10° C., and 45° C., respectively, and respective pipes are kept at temperatures 30° C. higher than respective precursor temperatures to prevent dew condensation in the pipes. This state is maintained for 30 minutes or longer. This procedure is performed for the purpose of stabilizing flows in the pipes by stabilizing the condition of an inner wall of each pipe, for example, by improving adsorption of the precursors. In addition, a Pt filament of an ammonia cracker is kept at a set temperature of 400° C.

In Step S202, the surface of the substrate prepared by filling the tungsten 903 in the hole in the SiO2[902] film in FIG. 9(a), and performing flattening by the CMP method is cleanly pretreated, then the substrate is transported to a susceptor in a reactor in a vacuum state, and then maintained in a vacuum state at a film forming temperature of 135° C. In Step S203, a carrier gas is flowed into the reactor 101 through a pipe 120 and an integrated valve 107, and the inside of the reactor is purged for two minutes at a pressure of 3 Torr, which is the same pressure as that employed in the film formation. By this process, a uniform surface temperature of the substrate is obtained and a uniform film can be formed with good reproducibility.

In Step S204, nitrogen as a purge gas is flowed into precursor containers of Ge, Sb, and Te at 10 cc/min, respectively, to stabilize the flows right up to the reactor through a vent line 108. This state is maintained for five minutes. The Pt filament of the ammonia cracker is kept at 400° C., and ammonia gas is flowed at 25 cc/min. This gas is also prevented from flowing into the reactor through the vent line, and the flow right up to the reactor is stabilized for five minutes.

Next, in Step S205, the purge was stopped and simultaneously the integrated valve 107 was operated to perform switching such that the Ge precursor was flowed into the reactor at 10 cc/min, and the precursor was introduced for 10 minutes. A seed layer having a thickness of 0.3 nm or less was formed on the substrate by this process. Pressure in the reactor at that time is 3 Torr. This seed layer forming process is performed for the purpose of improving reproducibility, and may be omitted. In addition, ammonia may be flowed at a flow rate of 25 cc/min through the ammonia cracker 110 simultaneously with the Ge precursor. In that case, the thickness of the seed layer increases to about 1 nm.

Then, in Step S206, the integrated valve is operated to simultaneously flow the Sb precursor, the Te precursor, and ammonia, together with the Ge precursor. Flow rates of Sb and Te precursors were 10 cc/min each, and a flow rate of ammonia was 25 cc/min. The pressure in the reactor was kept at 3 Torr. This state is maintained for 40 minutes. In Step S207, 40 minutes later, flows of the Ge, Sb, and Te precursors and ammonia are switched to the vent line, simultaneously therewith, nitrogen for purging is introduced into the reactor, and the pressure is kept at the same pressure as that employed in the film formation.

In Step S208, the substrate was kept at 135° C., which is the same temperature as that employed in the film formation, and the substrate was retained in the reactor for 30 minutes in a nitrogen atmosphere of 3 Torr. This process has an effect of releasing hydrogen trapped in the film during the film formation. Then, in Step S209, while flowing nitrogen, the pressure is kept at 3 Torr and the substrate temperature is decreased. When the substrate temperature is sufficiently decreased so that oxidation caused by oxygen in air can be negligible, a transportation system is operated to take the substrate out. A Ge2Sb2Te5 thin film 906 having a thickness of about 40 nm is obtained by the above process.

FIG. 9(b) illustrates the obtained switching characteristic. The figure is obtained by applying, between upper and lower electrodes of the phase change memory cell, a pulse having a width of 50 ns while increasing a voltage in increments of 50 mV. A set operation is observed at about 0.5 V, and a reset operation is observed at about 1.4 V. In the set operation, a phase change occurs from a high resistance state to a low resistance state, and in the reset operation, a phase change occurs from a low resistance state to a high resistance state. In addition, with this memory cell, switching can be performed a number of times as many as one million times, and it has been revealed that the phase change thin film prepared at low temperature according to the present invention is sufficiently practicable.

INDUSTRIAL APPLICABILITY

With the explosion of digital information, there has been an increasing demand for a non-volatile memory. Technology for preparing a three-dimensional memory cell is being established in recent years, and a phase change memory capable of retaining non-volatile information at low electric power is expected as a key device which replaces a hard disk in a data center and solves a problem of energy increase.

The present invention greatly contributes to the establishment of a method for MOCVD growth of a phase change film which is flat, has a good step coverage, and therefore essential for preparation of a three-dimensional phase change memory cell. The present invention is used as a main storage memory cell of a high-speed and large-capacity solid state drive (SSD) which replaces a hard disk.

REFERENCE SIGNS LIST

100 Air operated valve
101 Reactor main body container
102 Susceptor with built-in substrate heater
103 Exhaust pump
104 Film forming substrate
105 Shower head with temperature control function
106 Gas mixer
107 Integrated valve
108 Gas exhaust line
109 Ammonia cracker main body container
110 Filament for ammonia cracker
111 Mass flow controller for ammonia
112 Ammonia gas cylinder
113 Ge metal organic precursor
114 Sb metal organic precursor
115 Te metal organic precursor
116 Carrier nitrogen gas cylinder
117 Ge precursor supply line
118 Sb precursor supply line
119 Te precursor supply line
120 Purging nitrogen supply line
121 Mass flow controller for Ge carrier gas for Ge precursor
122 Mass flow controller for Sb carrier gas for Sb precursor
123 Mass flow controller for Te carrier gas for Te precursor
124 Mass flow controller for purging nitrogen gas
125 Nitrogen radical supply nozzle
S201 Process for preparing precursor gas
S202 Process for providing reactor with substrate
S203 Process for forming atmosphere in reactor before film formation
S204 Process for stabilizing flows of precursor gases
S205 Process for forming Ge seed layer on substrate
S206 Process for forming GeSbTe on substrate
S207 Process for ending film formation
S208 Process for evaporating residual gas in film
S209 Process for taking substrate out of reactor
300 Phase change memory cell
301 Phase change film
302 Lower electrode plug of phase change memory cell
303 Upper electrode of phase change memory cell 304 Word line of cell selecting transistor
305 Source of cell selecting transistor
306 Bit line of memory cell
307 Phase change memory cell
308 Memory cell selecting transistor
309 Gate electrode of cell selecting transistor
401 Gate electrode of memory transistor
402 Interlayer insulating film for separating gate electrodes vertically adjacent to memory transistor
403 Gate insulating film of MOS transistor
404 Polysilicon channel of MOS transistor
405 Phase change film
406 n-type polysilicon constituting pin diode for selecting vertical array
407 i polysilicon constituting pin diode for selecting vertical array
408 p-type polysilicon constituting pin diode for selecting vertical array
409 Lower word electrode of vertical array
410 Upper bit electrode of vertical array
411 Insulating film constituting cylindrical phase change film
601 Nitrogen radical supply line
701 Tungsten filament for ammonia cracker
702 Thin platinum catalyst wire for ammonia cracker
901 Si single crystal substrate
902 SiO2 interlayer insulating film
903 Lower tungsten plug electrode of phase change element
904 Lower wiring tungsten
905 Upper tungsten electrode of phase change element
906 Phase change CVD thin film

The invention claimed is:

1. An equipment for vapor phase growth of a phase change thin film using an organic metal raw material, the equipment comprising:
    metal organic precursor supply lines that transport each metal organic precursor independently for each metal element constituting a phase change film into a growth chamber with a carrier gas;
    a nitrogen radical supply line that is independent from the metal organic precursor supply line and supplies, into the growth chamber, a nitrogen radical generated by decomposing ammonia gas in a reaction chamber adjacent to the growth chamber; and
    on a substrate placed in the growth chamber, a gas mixer that switches the metal organic precursor supply lines to "alone" or "mixed" to supply the metal organic precursor,
    wherein the nitrogen radical supply line is open into the growth chamber such that the nitrogen radical uniformly reaches the substrate placed in the growth chamber, and
    wherein catalytic metal heated in vacuum is used to decompose ammonia gas in the reaction chamber.

2. The equipment for vapor phase growth of a phase change thin film according to claim 1, wherein
    the nitrogen radical supply line is connected to the gas mixer in the growth chamber, and
    the metal organic precursor and the nitrogen radical are mixed in the gas mixer right above the substrate, and then supplied to the substrate.

3. The equipment for vapor phase growth of a phase change thin film according to claim 1, wherein
    the metal organic precursor supply lines transport the metal organic precursor in containers atomized or vaporized by bubbling of the carrier gas or a vaporizer provided in the reaction chamber to the growth chamber with the carrier gas.

4. The equipment for vapor phase growth of a phase change thin film according to claim 1, wherein
    Pt, Pd, or Ir is used as the catalytic metal.

5. The equipment for vapor phase growth of a phase change thin film according to claim 1, wherein
    the catalytic metal is a wire-shaped workpiece, or a plate-shaped workpiece that has a structure with an increased surface area.

6. The equipment for vapor phase growth of a phase change thin film according to claim 1, wherein
    an electric current is flowed to the catalytic metal itself, and a temperature is controlled by Joule heating.

7. The equipment for vapor phase growth of a phase change thin film according to claim 1, wherein
    the catalytic metal is disposed so as to contact a filament separately provided, and the volume of the catalytic metal is decreased such that a ratio of surface area to volume is increased.

8. A method for vapor phase growth of a phase change thin film, the method comprising:
    transporting each metal organic precursors with a carrier gas to a substrate placed in a growth chamber, through an independent supply line for each of metal elements constituting a phase change film;
    supplying nitrogen radical generated by decomposing ammonia gas with heated catalytic metal in a reaction chamber adjacent to the growth chamber to the substrate placed in the growth chamber through an independent supply line; and
    forming a phase change thin film in an amorphous state on the substrate kept at a temperature of 150° C. or lower, by promoting decomposition of each of the metal organic precursors by the nitrogen radical.

9. The method for vapor phase growth of a phase change thin film according to claim 8, wherein
    carbon and nitrogen are included in the formed phase change thin film.

10. The method for vapor phase growth of a phase change thin film according to claim 8, wherein
    hydrogen trapped in the phase change thin film is released by introducing the carrier gas into the growth chamber and keeping, for a predetermined period of time, the substrate including the phase change thin film formed thereon at the same temperature and the same pressure as those employed in the film formation.

11. The method for vapor phase growth of a phase change thin film according to claim 8, wherein
    the metal elements constituting the phase change film include at least Ge.

12. The method for vapor phase growth of a phase change thin film according to claim 11, wherein
    the metal elements constituting the phase change film include Sb and/or Te as a constituent element other than Ge.

13. The method for vapor phase growth of a phase change thin film according to claim 12, wherein
    metal organic precursors of metal elements constituting the phase change film are selected such that the metal organic precursor of Ge has a lowest thermal decomposition temperature.

14. The method for vapor phase growth of a phase change thin film according to claim 12,
    wherein as an metal organic precursor of Ge, an amine complex is used.

15. The method for vapor phase growth of a phase change thin film according to claim 14, wherein the amine complex is (N,N'-diisopropyldimethylguanidyl)(dimethylamino)germanium(2).

16. The method for vapor phase growth of a phase change thin film according to claim 11, wherein
as an metal organic precursor of Ge, an amine complex is used, and preferably, (N,N'-diisopropyldimethylguanidyl)(dimethylamino)germanium(2) is used.

17. The method for vapor phase growth of a phase change thin film according to claim 16, wherein the amine complex is (N,N'-diisopropyldimethylguanidyl)(dimethylamino)germanium(2).

18. The method for vapor phase growth of a phase change thin film according to claim 8, wherein
immediately before the formation of a phase change thin film, the substrate surface is stabilized by using a Ge metal organic precursor and the nitrogen radical, and then other metal organic precursors are flowed into the growth chamber simultaneously to form a phase change thin film.

19. The method for vapor phase growth of a phase change thin film according to claim 18, wherein
the substrate is thermally treated while keeping at the same temperature and the same pressure as those employed in the film formation by flowing only the carrier gas into the growth chamber for vapor phase growth after a phase change thin film is formed.

* * * * *